United States Patent [19]

Lucas et al.

[11] 4,439,693
[45] Mar. 27, 1984

[54] SAMPLE AND HOLD CIRCUIT WITH IMPROVED OFFSET COMPENSATION

[75] Inventors: Charles H. Lucas, Newport Beach; Lanny L. Lewyn, Palo Alto, both of Calif.

[73] Assignee: Hughes Aircraft Co., El Segundo, Calif.

[21] Appl. No.: 316,453

[22] Filed: Oct. 30, 1981

[51] Int. Cl.$^3$ .................................................. G11C 27/02
[52] U.S. Cl. ...................................... 307/353; 307/520; 328/151; 328/162; 333/173
[58] Field of Search ................... 307/352, 353, 520; 328/151, 162, 165; 333/173; 330/9, 107

[56] References Cited

U.S. PATENT DOCUMENTS

| | | | |
|---|---|---|---|
| 3,050,673 | 8/1962 | Widmer | 307/353 |
| 4,151,429 | 4/1979 | Hupé | 328/165 |
| 4,163,947 | 8/1979 | Weedon | 328/162 |
| 4,365,204 | 12/1982 | Haque | 328/162 |

*Primary Examiner*—John Zazworsky
*Attorney, Agent, or Firm*—John Holtrichter, Jr.; A. W. Karambelas

[57] ABSTRACT

The auto-zeroing technique of this invention comprises two steps. In the first step, the differential amplifier output and negative input are shorted together and the resulting amplifier offset output voltage is stored across an input capacitor and a feedback capacitor, the input capacitor being connected between the amplifier negative input and a voltage source to be sampled and the feedback capacitor being connected between the amplifier negative input and ground. In the second step, the direct connection between the amplifier output and negative input is removed and the feedback capacitor is reconnected between the amplifier output and negative input in a feedback loop. At this time, a voltage of the same magnitude and opposite polarity as the original amplifier offset output voltage is applied as negative feedback across the amplifier, so that the amplifier offset output voltage is precisely zeroed. In an alternative embodiment, the connection and reconnection steps are performed at a frequency $f_c$ so that the device functions as a switched capacitor integrator.

16 Claims, 7 Drawing Figures

SAMPLE AND HOLD CIRCUIT WITH IMPROVED OFFSET COMPENSATION

TECHNICAL FIELD

This invention is related to sample and hold circuits useful in metal oxide semiconductor (MOS) integrated circuit data acquisition systems such as digital-to-analog converters.

BACKGROUND ART

High resolution metal oxide semiconductor (MOS) integrated circuit data acquisition systems such as digital-to-analog converters require sample-and-hold circuits with input voltage offsets in the low microvolt range and gain accuracy better than 0.01%. Such sample-and-hold circuits comprise a differential amplifier which has an inherent offset between its positive and negative input, giving rise to a permanent offset output voltage which is present even in the absence of an input signal, a significant disadvantage. Conventional techniques for minimizing the output offset voltage require the use of a large, off-chip, compensating capacitor to achieve the required levels of performance.

One conventional technique for minimizing the offset output voltage of a differential amplifier is to store the initial amplifier output offset voltage on the compensating capacitor by connecting the capacitor between the amplifier output and ground. Thereafter, the compensating capacitor is connected between the negative input of the differential amplifier and the output, so that a voltage having the same magnitude and opposite polarity as the amplifier output offset voltage is applied as negative feedback to the amplifier, thus approximately cancelling the offset output voltage of the amplifier. This technique is sometimes referred to as auto-zeroing.

Unfortunately, conventional auto-zeroing suffers from the limitation that the parasitic capacitance between the negative differential amplifier input and ground is charged during the reconnection of the compensating capacitor, which induces a gain inaccuracy in the amplifier output proportional to the parasitic capacitance at the amplifier input divided by the sum of the parasitic capacitance and the capacitance of the compensating capacitor. Accordingly, in order to maintain 0.01% gain accuracy, the capacitance of the compensating capacitor must be on the order of 1,000 pF, which is too large to be included on the integrated circuit, a significant disadvantage.

Another conventional auto-zeroing technique is to first store the offset voltage on the compensating capacitor in the manner previously described, but, instead of connecting the capacitor as an element in the negative feedback loop of the amplifier, the compensating capacitor is instead connected between the positive amplifier input and ground, after which the input signal is applied to the negative differential amplifier input so that the amplifier functions as a negative gain inverting stage. This latter auto-zeroing technique suffers from the disadvantage that the amplifier offset output voltage is not quite zeroed, the offset output voltage merely having been reduced by a factor proportional to the parasitic capacitance at the positive amplifier input divided by the sum of the parasitic capacitance and the capacitance of the compensating capacitor. Accordingly, a very large compensating capacitor must be used in both autozeroing techniques described here in order minimize gain inaccuracies in the first technique or minimize offset output voltages in the second technique, a significant disadvantage.

SUMMARY OF THE INVENTION

The effect of parasitic capacitance at the amplifier inputs on offset voltage and amplifier gain accuracy is minimized or removed in the auto-zeroing technique of the present invention. Specifically, the auto-zeroing technique of this invention comprises two steps. In the first step, the differential amplifier output and negative input are shorted together and the resulting amplifier offset output voltage is stored across an input capacitor and a feedback capacitor. The input capacitor is connected between the amplifier negative input and a voltage source to be sampled, and the feedback capacitor is connected beween the amplifier negative input and ground. In the second step, the direct connection between the amplifier output and negative input is removed and the feedback capacitor is reconnected between the amplifier output and negative input in a feedback loop. At this time, a voltage of the same magnitude and opposite polarity as the original amplifier offset output voltage is applied as negative feedback across the amplifier, so that the amplifier offset output voltage is precisely zeroed. The parasitic capacitance at the positive and negative inputs of the differential amplifier do not induce any inaccuracies in the auto-zeroing technique of this invention because the positive and negative input potentials of the amplifier remain unchanged during both the first and second steps so that none of the parasitic capacitances is charged or discharged. Accordingly, the amplifier gain is unaffected by the parasitic capacitances at the amplifier inputs, and so the amplifier offset output voltage is set precisely to zero volts with an accuracy virtually independent of the magnitude of the parasitic input capacitances of the amplifier, a significant advantage.

Thereafter, the voltage source connected to the input capacitor may be sampled at the amplifier output by disconnecting the input capacitor from the voltage source to be sampled and connecting it instead to ground. This produces a voltage at the output of the amplifier which is equal to the ratio of the capacitances of the input and feedback capacitors multiplied by the voltage of the source to be sampled at the time the input capacitor was disconnected from it. The gain of the amplifier is accurately determined by the selection of the input and feedback capacitors and is virtually unaffected by parasitic capacitance.

DESCRIPTION OF THE DRAWINGS

The invention is best understood by reference to the accompanying drawings, of which:

FIGS. 3a and 3b are simplified schematic diagrams illustrating the auto-zeroing technique of the present invention, in which FIG. 3a illustrates the sample step and FIG. 3b illustrates the hold step of the invention.

DETAILED DESCRIPTION

Figure 1A:
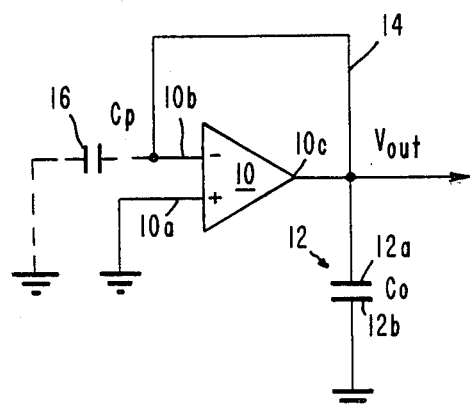
FIGS. 1a and 1b are simplified schematic diagrams illustrating a first conventional auto-zeroing technique of the prior art.

FIGS. 1a and b illustrate a first conventional auto-zeroing technique for minimizing the offset output voltage of a differential amplifier 10 having positive and negative inputs 10a, 10b and an output 10c. The problem is that if the differential amplifier 10 is to be used in a precision sample-and-hold circuit, an offset voltage $V_o$ will always be present at the output 10c even in the absence of any voltages applied to the inputs 10a, 10b due to an inherent voltage difference between the positive and negative inputs 10a, 10b within the amplifier 10. The object of conventional auto-zeroing techniques is to minimize the offset output voltage $V_{OUT}$ at the amplifier output 10c so that, ideally, in the absence of any input voltages applied to the inputs 10a, 10b, the offset output voltage $V_{OUT}$ at the output 10c is equal to zero.

Figure 1B:
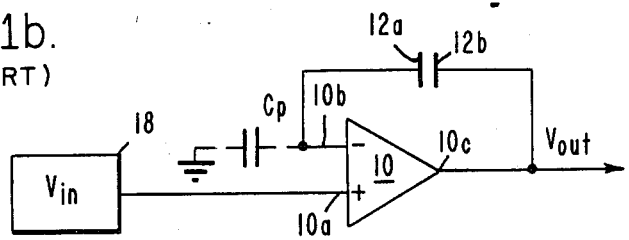

In the first conventional auto-zeroing technique illustrated in FIGS. 1a and b, a compensating capacitor 12 having a capacitance $C_0$ is connected to the output 10c while the output 10c and the negative input 10b are shorted directly to one another by a direct connection 14. The positive input 10a is grounded. As a result, the offset voltage $V_{OUT}$ is stored across the compensating capacitor 12. Thereafter, as illustrated in FIG. 1b, the short connection 14 between the output 10c and input 10b is removed and, instead, the compensating capacitor 12 is connected therebetween. However, FIG. 1b shows that the polarity of the capacitor 12 has been reversed with respect to the output 10c. Specifically, whereas plate 12a of the capacitor 12 is connected to the output 10c in FIG. 1a, the opposite capacitor plate 12b is connected to the output 10c in FIG. 1b. Accordingly, the capacitor applies a feedback voltage to the negative input 10b having the opposite polarity and same magnitude as the original offset voltage $V_{OUT}$. Therefore, the voltage at the amplifier output 10c is, in the ideal case, zero after the step illustrated in FIG. 1b has been accomplished. However, a parasitic capacitance 16 between the negative input 10b and ground is charged immediately upon reconnection of the capacitor 12 in the step of FIG. 1b. Accordingly, when the positive amplifier input 10a is disconnected from ground and is instead connected to an input voltage source 18 which is to be sampled, the amplifier 10 produces an output voltage $V_{out}$ which is proportional to the voltage $V_{in}$ of the source 18 with a gain error on the order of $C_p/(C_0+C_p)$. This error arises from the fact that the capacitors 12 and 16 function as a voltage divider feedback loop which determines the gain of the differential amplifier 10 in accordance with the formula stated above. The gain error, $C_p/(C_0+C_p)$ may be minimized by selecting a compensating capacitance $C_0$ to be extremely large (on the order 1,000 pF). This would make it difficult to place the compensating capacitor 12 on the same integrated circuit with the amplifier 10, a significant disadvantage.

Figure 2A:
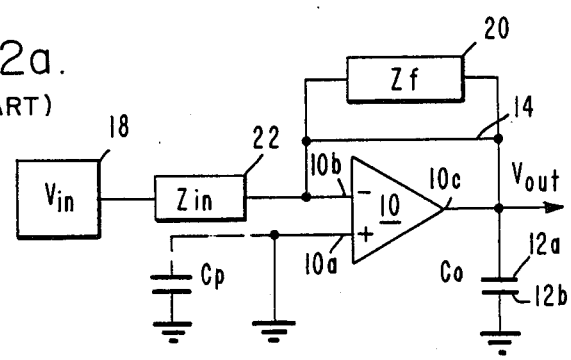
FIGS. 2a and 2b are simplified schematic diagrams illustrating a second conventional auto-zeroing technique of the prior art.
Figure 2B:
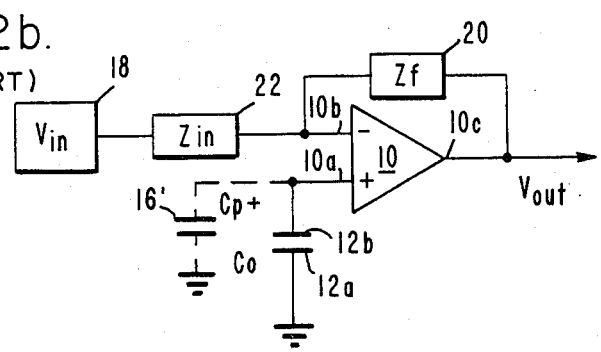

In a second conventional auto-zeroing technique, gain errors are avoided by reconnecting the compensating capacitor 12 between the positive amplifier input 10a and ground and connecting the input voltage source 18 to the negative input 10b. Specifically, the second auto-zeroing technique comprises two steps illustrated in FIGS. 2a and 2b. The first step illustrated in FIG. 2a is fundamentally the same as the step illustrated in FIG. 1a wherein the output 10c and negative input 10b are shorted together while the compensating capacitor 12 is connected between the output 10c and ground and the positive input 10a is also connected to ground. A voltage dividing feedback loop 20, 22 having constant impedances $Z_f$, $Z_n$, respectively, may be used to determine the gain of the amplifier 10. In the second step illustrated in FIG. 2b, the compensating capacitor 12 is reconnected between the positive input 10a and ground with its polarity reversed so that a voltage of opposite polarity and same magnitude as the original offset voltage $V_{OUT}$ is applied to the positive input 10b in the step of FIG. 2b so that the offset voltage at the output 10c is minimized. There is no gain error because the gain has been set by the selection of the impedances $Z_n$, $Z_f$. However, parasitic capacitance 16' between the positive input 10a and ground is charged immediately upon the reconnection of the compensating capacitor 12 in the step of FIG. 2b. Accordingly, it may be shown that the new offset voltage present at the output 10c in the step illustrated in FIG. 2b is equal to $V_0 C_p/(C_0+C_p)$. Accordingly, the offset voltage at the output 10c is not precisely zeroed and can only be minimized by the use of a compensating capacitor 12 having an extremely large capacitance $C_0$ (on the order of 1,000 pF). Such a capacitor requires a large area on the integrated circuit substrate on which the differential amplifier is formed, a significant disadvantage.

Figure 3A:
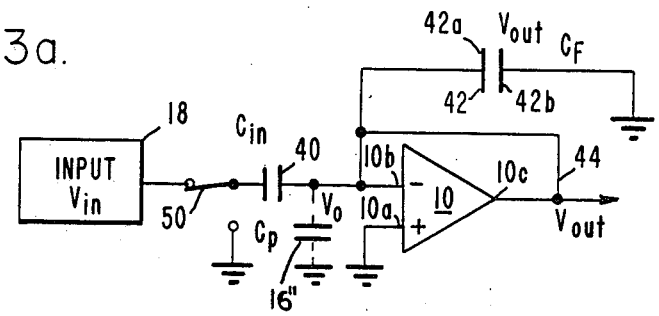
Figure 3B:
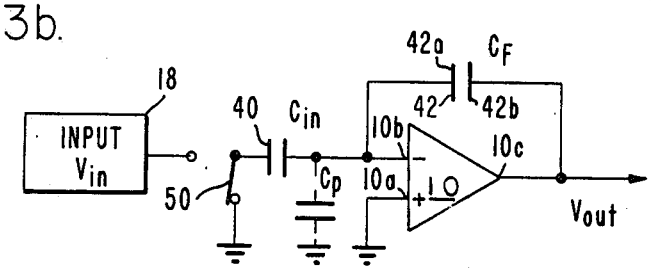

In the present invention, the foregoing disadvantages are overcome in the novel auto-zeroing technique illustrated in FIGS. 3a and 3b. FIG. 3a illustrates the sampling step of the auto-zeroing technique of this invention in which the voltage $V_{in}$ of the input source 18 is sampled. During the sample step illustrated in FIG. 3a, the offset voltage $V_o$ of the amplifier 10 is stored across an input capacitor 40 of capacitance $C_{in}$ and a feedback capacitor 42 of capacitance $C_f$, the input capacitor being connected between the amplifier negative input 10b and the input source 18 and the feedback capacitor 42 being connected between the amplifier output 10c and ground. At the same time, the output 10c and the negative input 10b are shorted together by a direct connection 44 while the positive input 10a is connected to ground. During the step illustrated in FIG. 3a, the offset voltage $V_0$ is present at both the output 10c and the output 10b by virtue of the direct connection 44 between them. Furthermore, during the sampling step of FIG. 3a, the offset voltage $V_0$ is stored across the feedback capacitor 42.

Subsequently, a hold-step is performed which is illustrated in FIG. 3b. In this step, plate 42a of the feedback capacitor 42 remains connected to the negative input 10b while opposite plate 42b of the feedback capacitor 42 is disconnected from ground and reconnected instead to the amplifier output 10c. As a result, the feedback capacitor 42 applies the offset voltage $V_0$ as negative feedback from the output 10c to the negative input 10b. Accordingly, the voltage at the amplifier output 10c at this time is precisely equal to zero. The parasitic capacitance 16" present at the negative input 10b has virtually no effect because the offset voltage $V_0$ present at the input 10b during the sample step of FIG. 3a remains unchanged in the hold step of FIG. 3b, so that no charging or discharging of the parasitic capacitance 16 occurs during these steps. There is no charging or discharging of the parasitic capacitance 16 because the capacitor plate 42a is never disconnected from the negative input 10b. As a result, the accuracy with which the offset voltage at the output 10c is zeroed is virtually unaffected by parasitic capacitance in the present invention, a significant advantage.

Thereafter, a switch 50 may be used to disconnect the input capacitor 40 from the input voltage source 18 and reconnect the input capacitor 40 instead to ground. The voltage across the input capacitor 40 is reduced by a voltage $-V_{in}$ determined by the voltage $+V_{in}$ of the input voltage source 18 at the time the switch 50 was actuated. Accordingly, the output voltage $V_{out}$ at the amplifier output 10c becomes $V_{in}(C_{in}/C_f)$. The ratio $(C_{in}/C_f)$ is the gain of the amplifier and is determined by the capacitances $C_{in}$ and $C_f$ which function as a voltage dividing negative feedback loop in the manner well-known to those skilled in the art. If the capacitance $C_{in}$ and $C_f$ are selected to be equal to one another, the voltage $V_{out}$ will be precisely equal to the voltage $V_{in}$ when the switch 50 is moved to the solid-line position illustrated in FIG. 3b. Significantly, the amplifier gain is set precisely by selection of the capacitances $C_{in}$ and $C_f$ so that gain inaccuracies are effectively minimized or removed in the auto-zeroing technique of the present invention illustrated in FIGS. 3a and 3b. Accordingly, the invention realizes two advantages, namely, the elimination of gain error due to parasitic capacitance and the precise zeroing of the output offset voltage $V_o$ independently of the magnitude of the parasitic capacitance $C_p$.

Figure 4:
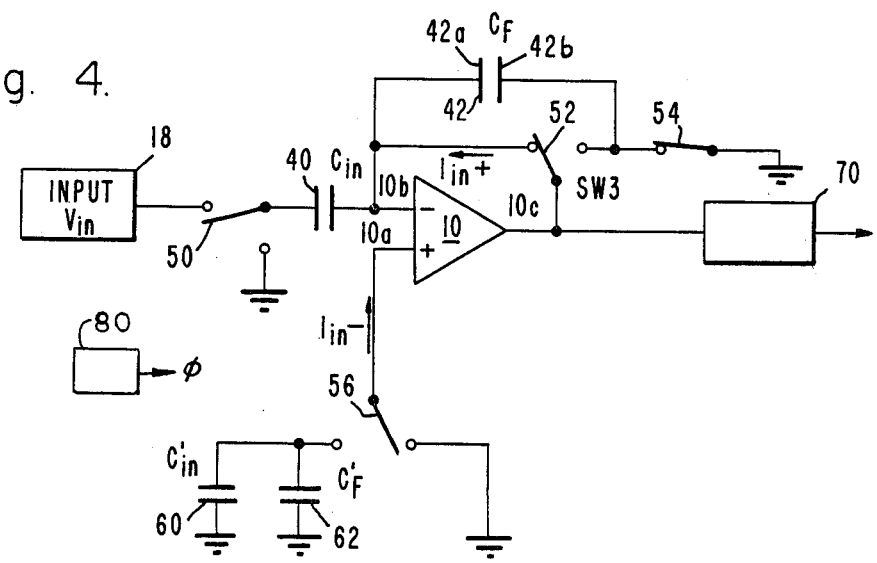
FIG. 4 is a simplified schematic diagram illustrating the preferred embodiment of the present invention.

FIG. 4 is a simplified schematic diagram illustrating the preferred embodiment of the invention, which is a metal oxide semiconductor circuit formed on a semiconductive substrate and has the capability to perform the sample and hold steps illustrated in FIGS. 3a and 3b. Specifically, the switch 50 permits alternate connection of the input capacitor 40 to the input voltage source 18 and ground, as mentioned previously. The switch 52 permits the alternate connection of the amplifier output 10c to the amplifier negative 10b and to plate 42b of the feedback capacitor 42. The switch 54 permits connection of the feedback capacitor 42b to ground. In the sample step of FIG. 3a, the switch 50 is connected between the input voltage source 18 and the input capacitor 40, and the switch 52 is connected between the output 10c and the negative input 10b while the switch 54 is closed to connect the feedback capacitor plate 42b to ground. During the hold step of FIG. 3b, the position of all of the switches 50, 52, 54 is reversed so that the switch 50 connects the input capacitor 40 to ground, the switch 52 connects the amplifier output 10c to the feedback capacitor plate 42b while the switch 54 disconnects the feedback capacitor plate 42b from ground.

An additional feature of the invention is a switch 56 and capacitors 60 and 62 having capacitance $C_{in'}$ and $C_f$, respectively. The switch 56 is operated during the hold step of FIG. 3b to disconnect the positive amplifier input 10a from ground and connect it instead to the capacitors 60, 62. The capacitances $C_{in'}$ and $C_f$ are selected to be proportional to the capacitances $C_{in}$ and $C_f$ of the input and feedback capacitors 40, 42, respectively. The purpose of the capacitors 60, 62 is to provide compensation for the leakage currents $I_{in-}$ and $I_{in+}$ which leak through the switches 56 and 52, respectively, during the hold step of FIG. 3b. Typically, each of the switches 52, 56 is formed as a metal oxide semiconductor field effect transistor (MOSFET). Such a switch typically has junction leakage which is a well-known problem in the art and causes the leakage currents $I_{in-}$ and $I_{in+}$.

In the preferred embodiment of FIG. 4, the amplifier output 10c is connected to a channel charge compensated switch 70 which is described in U.S. Patent application Ser. No. 316,175, filed herewith by Lanny L. Lewyn and Charles H. Lucas and entitled "Channel Charge Compensated Switch with First Order Process Independence" and assigned to the assignee of the present invention. Use of the channel charge compensated switch 70 in place of conventional switches prevents the voltage $V_{out}$ stored on the amplifier output node 10c in the hold-step of FIG. 3b from being distorted by charge stored in the source-to-drain channel of the switched MOSFET's. Of course, a channel charge compensated switch of the type described in the above-referenced application by Lewyn and Lucas may also be used in place of each of the switches 50, 52, 54, 56 in the preferred embodiment of FIG. 4.

SWITCHED CAPACITOR INTEGRATOR

The switch 54 in FIG. 4 may be omitted, and the switches 50, 52 may be operated as described previously, but in synchronism with a clock signal $\Phi$ of frequency $F_c$ derived from a clock signal generator 80. In this case, the circuit of FIG. 4 becomes a switched capacitor integrator or typical filter element with scale factor $\tau = C_F/(F_c C_{in})$. In this switched capacitor integrator, the switches 50, 52 are operated at the frequency $F_C$ in synchronism with the clock signal $\Phi$. During a first phase (or a "reset" phase), the switch 50 is connected to the input voltage source 18 while the switch 52 is connected to the negative input 10b. In a second phase (or an "output" phase), the switch 50 is connected to ground while the switch 52 is connected to the feedback capacitor plate 42b. The output voltage $V_{out}$ at the amplifier output 10c corresponds to the time domain integral of the signal represented by the voltage $V_{in}$ of the source 18 with the scale factor $\tau$ defined previously. Stated mathematically, if the switches 50, 52 are operated in synchronism with the clock signal $\Phi$, the following obtains:

$$V_{out} = \int_0^t V_{in} e^{it/\tau} dt$$

where $$\tau = C_f/(f_C C_{in}).$$

In the switched capacitor integrator of this invention, a major source of dynamic range limitation, mainly 1/f noise of the type well-known in the art, is considerably reduced when the clock frequency $f_C$ is chosen near or above the peak 1/f noise frequency of the amplifier 10. As is well known in the art, the term "1/f noise" refers to that type of noise which is proportional to the reciprocal of the frequency. Although the output voltage of the amplifier 10 is not usable during the reset phase (that is to say, the foregoing equation does not apply during the reset phase) it is a simple matter to follow the amplifier output 10c with a sample-and-hold device (such as the sample-and-hold circuit of the present invention) which retains the previous voltage $V_{out}$ of the switch capacitor integrator during the reset phase. However, this may not be necessary because, in some application, an output voltage $V_{out}$ is not required during the reset phase.

In summary, the auto-zeroing sample-and-hold circuit of the present invention stores a sample voltage $V_{out}$ on its output node 10c which is precisely equal to the amplifier gain ($C_{in}/C_f$) multiplied by the voltage $V_{in}$ of the input source at the precise time that the source was sampled. The voltage $V_{out}$ at the output node 10c is proportional to the input voltage $V_{in}$ with a precision virtually unaffected by parasitic capacitance at the amplifier inputs 10a and 10b and with an offset voltage (or bias) which has been zeroed with a precision similarly unaffected by parasitic capacitance.

What is claimed is:

1. A sample-and-hold circuit having auto-zeroing, comprising:
   a differential amplifier having positive and negative inputs and an output;
   an input voltage source to be sampled;
   a feedback capacitor having two plates, one of said plates being continuously connected to said negative amplifier input;
   connecting means for connecting the other of said feedback capacitor plates to a common reference potential while shorting said amplifier output to said negative input, and for disconnecting said amplifier output from said negative input while disconnecting said other capacitor plate from said reference potential and reconnecting it instead to said amplifier output; and
   sampling means for sampling said input voltage source comprising a switch for coupling said amplifier negative input to said input voltage source whenever said other plate of said feedback capacitor is connected to said reference potential and for decoupling said negative amplifier input from said input voltage source whenever said other feedback capacitor plate is connected to said amplifier output, said positive amplifier input being connected to said reference potential at least whenever said other feedback capacitor plate is connected to said reference potential.

2. The sample-and-hold circuit of claim 1 wherein said sampling means couples said negative amplifier input to said reference potential whenever said other plate of said feedback capacitor is connected to said amplifier output.

3. The sample-and-hold circuit of claim 1 further comprising an input capacitor connected between said negative amplifier input and said sampling means.

4. The sample-and-hold circuit of claim 1 wherein said connecting means comprise a first switch connected to said amplifier output and alternately connectable to said other feedback capacitor plate and said negative amplifier input and a second switch connectable between said reference potential and said other feedback capacitor plate.

5. The sample-and-hold circuit of claim 1 further comprising compensation means associated with said connecting means for compensating for junction leakage through said connecting means.

6. The sample-and-hold circuit of claim 5 wherein said compensating means comprise a junction leakage compensating capacitor and means for connecting said compensating capacitor to said positive amplifier input whenever said other feedback capacitor plate is connected to said amplifier output.

7. A sample-and-hold circuit having auto-zeroing, comprising:
   a differential amplifier having positive and negative inputs and an output;
   an input voltage terminal;
   a compensating feedback capacitor having first and second terminals, said first terminal connected to said negative amplifier input;
   a first switch alternatively connecting said amplifier output to said negative amplifier input and to said second terminal of said compensating capacitor;
   a second switch controlling the coupling of said negative amplifier input to said input voltage terminal; and a third switch connected between said compensating capacitor second terminal and a common reference potential and wherein said second switch is alternatively connectable to said input voltage source and said common reference potential.

8. The sample-and-hold circuit of claim 7 further comprising a fourth switch and a junction leakage compensating capacitor, said fourth switch connected between said positive amplifier input and alternatively to said reference potential and said leakage compensating capacitor.

9. The circuit of claim 7 further comprising means for operating said first and second switches in synchronism with a clock signal $\Phi$ of frequency $f_C$.

10. A switched capacitor integrator, comprising:
    a differential amplifier having positive and negative inputs and an output;
    an input voltage terminal;
    a feedback capacitor of capacitance $C_f$ having first and second terminals, said first terminal connected to said negative amplifier input;
    a first switch alternatively connecting said amplifier output to said negative amplifier input and to said second feedback capacitor terminal;
    a second switch connected to said negative amplifier input and alternatively connectable to said input voltage terminal and a common reference potential; and
    means for operating said first and second switches in synchronism with one another at a frequency $f_C$.

11. The switched capacitor integrator of claim 10 further comprising an input capacitor of capacitance $C_{in}$ connected between said negative amplifier input and said second switch.

12. The switched capacitor integrator of claim 11 wherein the voltage $V_{out}$ at said amplifier output is determined by the voltage $V_{in}$ at said input voltage terminal as follows:

$$V_{out} = \int dt V_{in} e^{it/\tau}, \text{ where } \tau = (1/f_C)(C_f/C_{in}).$$

13. In a sample-and-hold circuit including a differential amplifier having positive and negative inputs and an output, an input voltage node to be sampled and a voltage storage means having two terminals, a method for auto-zeroing, comprising:
    (a) holding one of said voltage storing terminals to said negative amplifier input;
    (b) first performing the following steps:
        (1) connecting the other of said voltage storing terminals to a common reference potential;
        (2) connecting said amplifier output to said negative amplifier input;
        (3) connecting said input voltage node to said negative amplifier input; and
    (c) secondly performing the following steps:
        (1) disconnecting said amplifier output and said amplifier negative input;
        (2) disconnecting said other voltage storing terminal from said common reference potential;

(3) connecting said other voltage storing terminal to said amplifier output;

(4) diconnecting said input voltage node from said negative amplifier input;

(5) connecting said negative amplifier input to said common reference potential.

14. The auto-zeroing method of claim 13 further comprising holding said positive amplifier input to said common reference potential.

15. The auto-zeroing method of claim 13 wherein said sample-and-hold circuit further comprises a second voltage storing means having two terminals, a first one of said second voltage storing means terminals being connected to said common reference potential, said method further comprising connecting said positive amplifier input directly to said common reference potential whenever said negative amplifier input and output are connected together, and connecting said positive amplifier input to said second terminal of said second voltage storing means whenever said amplifier negative input and output are disconnected from one another.

16. The auto-zeroing method of claim 13 wherein, in step (b)(3), said connection step is performed by connecting said input voltage node through a capacitor to said negative amplifier unit.

* * * * *